(12) United States Patent
Byun et al.

(10) Patent No.: US 9,315,897 B2
(45) Date of Patent: Apr. 19, 2016

(54) SHOWERHEAD FOR FILM DEPOSITING VACUUM EQUIPMENT

(75) Inventors: Chulsoo Byun, Seoul (KR); Man Cheol Han, Seoul (KR); Il Yong Chung, ChungNam (KR); Seok Woo Lee, GyungGi-do (KR)

(73) Assignee: Korea Institute of Industrial Technology, Cheonan-si (KR)

( * ) Notice: Subject to any disclaimer, the term of this patent is extended or adjusted under 35 U.S.C. 154(b) by 1118 days.

(21) Appl. No.: 13/375,434

(22) PCT Filed: May 13, 2010

(86) PCT No.: PCT/KR2010/003024
§ 371 (c)(1),
(2), (4) Date: Nov. 30, 2011

(87) PCT Pub. No.: WO2010/140778
PCT Pub. Date: Dec. 9, 2010

(65) Prior Publication Data
US 2012/0067971 A1    Mar. 22, 2012

(30) Foreign Application Priority Data

Jun. 1, 2009    (KR) .......................... 10-2009-0048290

(51) Int. Cl.
*C23C 16/455*    (2006.01)

(52) U.S. Cl.
CPC ...... *C23C 16/45565* (2013.01); *C23C 16/45572* (2013.01); *C23C 16/45574* (2013.01); *C23C 16/45576* (2013.01); *C23C 16/45591* (2013.01); *C23C 16/45563* (2013.01)

(58) Field of Classification Search
CPC .................. C23C 16/45565; C23C 16/45574; C23C 16/45572; C23C 16/45591; C23C 16/45576; C23C 16/45563
See application file for complete search history.

(56) References Cited

U.S. PATENT DOCUMENTS

| | | | | |
|---|---|---|---|---|
| 5,871,586 | A  * | 2/1999 | Crawley et al. | 118/715 |
| 6,089,472 | A  * | 7/2000 | Carter | 239/422 |
| 8,308,865 | B2 * | 11/2012 | Kim | C23C 16/45514 118/715 |
| 2004/0209487 | A1* | 10/2004 | Choi et al. | 438/788 |
| 2005/0092248 | A1* | 5/2005 | Lee | C23C 16/45565 118/715 |
| 2007/0148349 | A1* | 6/2007 | Fukada | C23C 16/45565 427/248.1 |
| 2007/0272154 | A1* | 11/2007 | Amikura | C23C 16/45565 118/719 |
| 2010/0003405 | A1* | 1/2010 | Kappeler | C23C 16/45551 427/255.28 |
| 2010/0143588 | A1* | 6/2010 | Belousov et al. | 427/255.28 |
| 2011/0023782 | A1* | 2/2011 | Han | C23C 16/45565 118/724 |

(Continued)

*Primary Examiner* — Jeffrie R Lund
(74) *Attorney, Agent, or Firm* — D. Peter Hochberg; Sean F. Mellino (57) ABSTRACT

A showerhead for film-depositing vacuum equipment having an effect shortening the length of injection tubes for a reactive gas is presented. The injection tubes extend from the bottom of a reactive gas showerhead module, and two different kinds of reactive gases are mixed with an injection support gas within a reactive showerhead module so as to inject the mixed gas. The showerhead for film-depositing vacuum equipment includes the reactive gas showerhead module above a cooling jacket and a purge gas showerhead module above the reactive gas showerhead module. The injection tubes of the reactive gas showerhead module pass through the cooling jacket disposed below the reactive gas showerhead module, and the injection tubes of the purge gas showerhead module pass through the reactive gas showerhead module disposed below the purge gas showerhead module, thereby enabling the purge gas to flow into a purge gas redistribution space defined above the cooling jacket.

6 Claims, 7 Drawing Sheets

(56) References Cited

U.S. PATENT DOCUMENTS

| | | | | |
|---|---|---|---|---|
| 2011/0048325 | A1* | 3/2011 | Choi | C23C 16/452 118/712 |
| 2011/0052833 | A1* | 3/2011 | Hanawa | C23C 16/4404 427/534 |
| 2012/0000490 | A1* | 1/2012 | Chung | B08B 7/0035 134/22.12 |

* cited by examiner

SHOWERHEAD FOR FILM DEPOSITING VACUUM EQUIPMENT

This application is a National Stage application of International Application No. PCT/KR2010/003024, filed on May 13, 2010, which claims priority of Korean Application Serial No. 10-2009-0048290 filed on Jun. 1, 2009.

BACKGROUND OF THE INVENTION

1. Field of the Invention

The present invention relates to a showerhead for film-depositing vacuum equipment and, more particularly, to a showerhead for film-depositing vacuum equipment, which uniformly and stably supplies a process gas onto a substrate during a film deposition process, such as chemical vapor deposition, thereby improving the quality of the formed film and preventing the undesired deposition of particles.

2. Description of the Prior Art

In response to the ongoing high-integration of semiconductor devices, the need becomes stronger to control process parameters more precisely in fabrications of semiconductor devices including a film deposition process. Many efforts are done to achieve process reliability amongst and within substrates.

In particular, studies are underway to improve process reliability in an equipment that adopts a showerhead for supplying a process gas during chemical vapor deposition in which a film is deposited on a substrate by a surface chemical reaction. Recently, an attempt to make an easy adjustment of components in films by controlling the injection velocity of reactive gasses was introduced in Korean Patent No. KR 100849929 (Korean Publication No. KR 20080025277) (hereinafter, referred to as Cited Document 1).

Referring to Cited Document 1, a reactive gas and an injection support gas are mixed inside a showerhead and are injected onto a substrate. In addition, it is possible to minimize backward diffusion of the reactive gas towards the showerhead and unwanted deposition of particles resulting from the reaction of reactive gas and/or byproduct gasses on the bottom of the showerhead, which becomes enabled by separately injecting a purge gas towards the substrate. In addition, it is also possible to suppress ring-shaped contamination on the exit end of the reactive gas injection tubes by injecting the purge gas while surrounding the exit end of the reactive gas injection tube.

Here, the reactive gas refers to a source gas, which contains a component of a film to be deposited. The injection support gas refers to a kind of gas that is used to adjust the injection velocity of the reactive gas by being mixed with the reactive gas at inside of the showerhead, which generally includes inert gases that are unlikely to undergo a chemical reaction with the reactive gas. In addition, the purge gas refers to a gas that is used to adjust the total flow rate and to prevent bottom surface of the showerhead from being contaminated. The purge gas is not necessarily limited to an inert gas and may be another kind of gas. Examples of the purge gas are Ar, $N_2$, $O_2$, He, $H_2$, $NH_3$, $AsH_3$, $PH_3$, or the like, and they may include a chemical component of a film to be deposited, but rarely do they decompose or leave behind a deposition inside the showerhead.

The purge gas needs to be very uniformly injected. Otherwise, it may result in unintended particle deposition on some portion of the showerhead and cause a non-uniformity of deposition. Therefore, it is very important to uniformly inject the purge gas.

Figure 1:
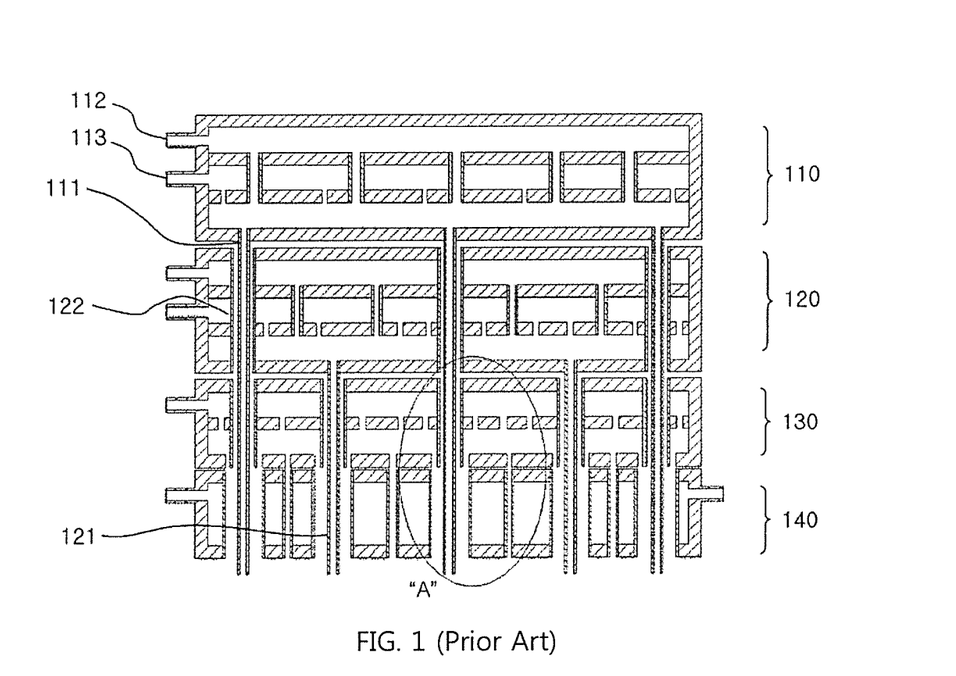
FIG. 1 is a cross-sectional configuration view showing a showerhead of the related art.
Figure 2:
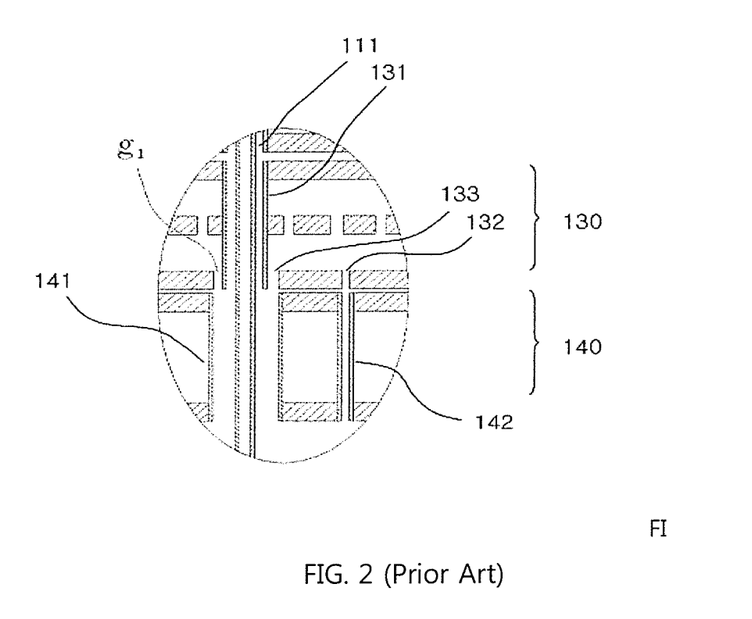
FIG. 2 is a detailed view of part "A" in FIG. 1.

FIG. 1 shows the configuration of a showerhead disclosed in Cited Document 1. As shown in the figure, two reactive gas showerhead modules 110 and 120, one purge gas showerhead module 130 and a cooling jacket 140 are sequentially stacked from top to bottom. FIG. 2 shows a detailed view of the vicinity of guide tubes 131 and 141 through which reactive gas injection tubes 111 extended from the reactive gas showerhead module 110 pass through the cooling jacket 140. As shown in the figure, if there is substantially no space between the purge gas showerhead module 130 and the cooling jacket 140, it is difficult to uniformly distribute the purge gas to the guide tubes 141 and 142 by merely aligning a purge gas injection hole 132 or a purge gas outlet 133 with guide tubes 142 or 141 mounted at the cooling jacket 140, respectively.

Figure 3:
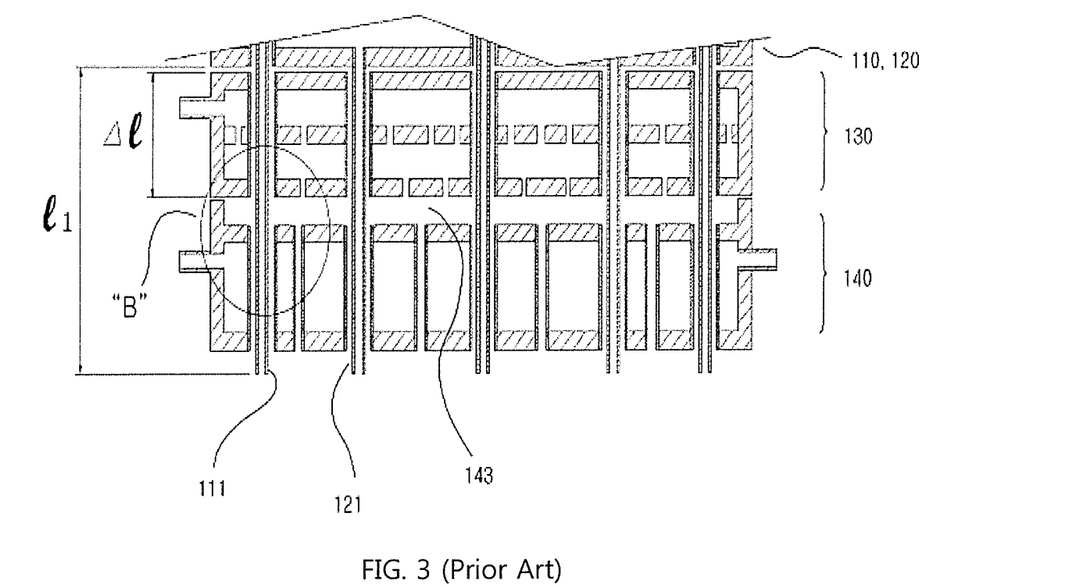
FIG. 3 is cross-sectional configuration view showing another type of showerhead of the related art.
Figure 4:
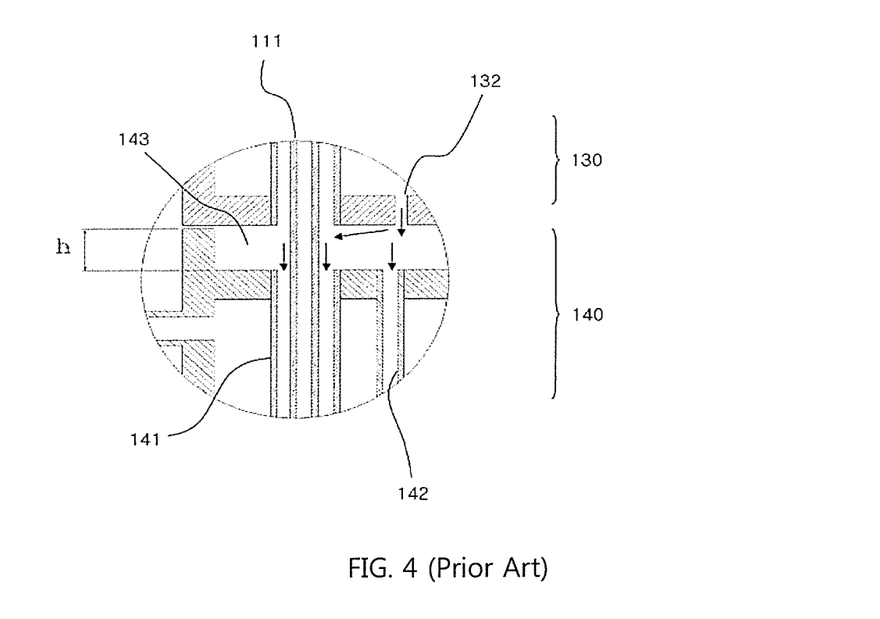
FIG. 4 is a detailed view of part "A" in FIG. 3.

In order to solve above problem, Korean Patent Application Publication No. 10-2007-0112354 (hereinafter, referred to as Cited Document 2) proposed a purge gas redistribution space 143 having a predetermined thickness, indicated by "h," between the purge gas showerhead module 130 and the cooling jacket 140, as shown in FIG. 3 and FIG. 4. However, according to Cited Document 2, the length (l1 in FIG. 3) of the reactive gas injection tubes 111 and 121, which are connected to the bottoms of the reactive gas showerhead modules 110 and 120, must be longer than the height ($\Delta l$ in FIG. 3) of the purge gas showerhead module 130. As several reactive gas showerhead modules 110 and 120 are sequentially stacked on the purge gas showerhead module 130, the length of the reactive gas injection tubes 111 and 121 which are connected to the bottom of the reactive gas showerhead modules 110 and 120, increases further.

The presence of $\Delta l$ that has to be basically included may cause drawbacks, such as warping in the tubes or difficulty in assembling during fabrication processes or maintenances of the showerhead. As the length of the reactive gas injection tubes 111 and 121 is increased, a problem of traveling a longer distance from the reactive gas showerhead modules 110 and 120 to the bottom of the cooling jacket 140 may result. In an example, a large pressure drop may make it difficult to efficiently supply the reactive gas to the substrate. In addition, when depositing several layers of a film, a reactive gas during the former step may reside inside the showerhead at the next step.

In addition, in conventional film-depositing vacuum equipments, in case that the kind of the reactive gas being introduced into a reaction chamber (not shown) is to be changed, it is usually done by the manipulation of valves. That is, a switching method has been used. However, there is a possibility that the changed process gas may flow back towards the former process gas line. As long as different kinds of process gases are commonly used in one process gas supply tube, the problem of contamination still exists. Therefore, it is preferable that a dedicated process gas supply line is used for one kind of process gas.

When process gases having different properties are mixed inside the showerhead that serves to uniformly inject the process gases onto the substrate, for example, when a Tri-Methyl Gallium (TMG) process gas is used as a source of Ga and an $NH_3$ process gas is used as a source of N and these are mixed together inside the showerhead in the process of depositing a GaN film for an LED by MOCVD, an unintended gas reaction may occur inside the showerhead, thereby forming particles.

Therefore, in such a case, a post-mixing method is generally used; i.e. different process gases pass through the showerhead without being mixed together, but are mixed together between the showerhead and the substrate.

FIG. 1 showing the configuration of Cited Document 1 illustrates a related technology. That is, a first reactive gas that has been introduced to the inside of the reactive gas showerhead module 110 through an inlet 112 is mixed with an injection support gas that has been introduced to the inside through another inlet 113 in order to regulate the injection velocity of the reactive gas. The mixed gas passes through guide tubes 122 along the inside of the reactive gas injection tubes 111, thereby passing through the inside of the reactive gas showerhead module 120 below. The first mixed gas, without being mixed with the second reactive gas within the showerhead, is then injected towards the substrate (not shown) placed inside the reaction chamber.

In this configuration, however, an increase in the number of reactive gases which constitute the elements of the film may result in the showerhead of a complicated structure. FIG. 1 shows that the two reactive gas showerhead modules 110 and 120 are stacked in the vertical direction. However, continuously increasing the number of the reactive gas showerhead modules in response to an increase in kinds of the reactive gases may cause a problem due to the limited space allocated to the inside of the reaction chamber.

SUMMARY OF THE INVENTION

Accordingly, the present invention has been made keeping in mind the above problems existing in the related art, and is intended to provide a showerhead for film-depositing vacuum equipment, in which a reactive gas showerhead module is disposed above a cooling jacket while defining a purge gas redistribution space between the reactive gas showerhead module and the cooling jacket, a purge gas showerhead module is disposed above the reactive gas showerhead module, so that the length of reactive gas injection tubes, which are connected from the bottom of the reactive gas showerhead module, can be decreased, thereby overcoming problems, such as warping of the tube or difficulty in assembling during fabrication processes or maintenances of the showerhead. It is also possible to overcome the problems of pressure loss caused by increased length of the reactive gas injection tubes, difficulty in properly supplying the reactive gas, and remaining of the reactive gas in the former process inside the showerhead when depositing several layers of a film.

The present invention is also intended to provide a showerhead for film-depositing vacuum equipment, in which reactive gases are mixed together inside one reactive gas showerhead module, as long as they have similar properties such that they do not undergo a chemical reaction and thus rarely form particles inside the reactive gas showerhead module. As a result, this can keep the number of the reactive gas showerhead modules low even though kinds of reaction gases increases, thereby solving the problems associated with the overall configuration and assembly of the showerhead and the problem resulting from the limited space inside the reaction chamber.

In an aspect, the present invention provides a showerhead for film-depositing vacuum equipment, comprising a reactive gas showerhead module which has an inlet through which a reactive gas is introduced and a plurality of injection tubes through which the reactive gas is injected, a purge gas showerhead module which has an inlet through which a purge gas is introduced and a plurality of injection tubes through which the purge gas is injected, a cooling jacket which has an inlet and an outlet through which coolant is respectively introduced and discharged, and a purge gas redistribution space defined above the cooling jacket. The reactive gas showerhead module is disposed above the cooling jacket, the purge gas showerhead module is disposed above the reactive gas showerhead module, the injection tubes of the reactive gas showerhead module extend through the cooling jacket located below, and the injection tubes of the purge gas showerhead module extend through the reactive gas showerhead module located below. The purge gas that has been injected from the purge gas injection holes is introduced into the purge gas redistribution space defined above the cooling jacket by passing through the reactive gas showerhead module. The reactive gas and the purge gas are injected towards the substrate after passing through the cooling jacket without coming into contact with coolant inside the cooling jacket.

The present invention is also characterized in that another reactive gas showerhead module is further disposed between the reactive gas showerhead module and the purge gas showerhead module, in which injection tubes of the reactive gas showerhead module located at upper position extend through the lower reactive gas showerhead module and the cooling jacket.

The present invention is characterized in that another reactive gas showerhead module is further disposed above the purge gas showerhead module, in which injection tubes of the reactive gas showerhead module located at upper position extend through the purge gas showerhead module, the reactive gas showerhead module, and the cooling jacket, sequentially.

The present invention is also characterized in that the reactive gas showerhead module has first and second intermediate plates between upper and bottom plates, in which a plurality of reactive gases are introduced into a space between the upper plate and the first intermediate plate through a plurality of inlets, an injection support gas is introduced into a space between the first and second intermediate plates through an inlet, and the plurality of reactive gases and the injection support gas are mixed together inside the mixing chamber which is a space between the second intermediate plate and the bottom plate, thereby forming a mixture gas.

Furthermore, the present invention is characterized in that the reactive gas showerhead module has first to third intermediate plates between the upper and bottom plates, in which a reactive gas is introduced into a space between the upper plate and the first intermediate plate, another reactive gas of a different kind is introduced into a space between the first and second intermediate, an injection support gas is introduced into a space between the second and third intermediate plates through a third inlet, and the plurality of reactive gases and the injection support gas are mixed together inside the mixing chamber which is a space between the third intermediate plate and the bottom plate, thereby forming a mixture gas.

As described above, the reactive gas showerhead module is disposed above the cooling jacket, the purge gas showerhead module is disposed above the reactive gas showerhead module, and the injection tubes of the reactive gas showerhead module extend through the cooling jacket below, such that the purge gas is introduced into the purge gas redistribution space between the reactive gas showerhead module and the cooling jacket. The length of the reaction injection tubes connected from the bottom of the reactive gas showerhead module can thus be shortened. Consequently, it is possible to overcome problems, such as a warping of the tube or difficulty in assembling during fabrication processes or maintenances of the showerhead. It is also possible to overcome the problems of pressure loss caused by increased length of the reactive gas injection tubes, difficulty in properly supplying the reactive gas, and remaining of the reactive gas in the former process inside the showerhead when depositing several layers of a film.

Furthermore, a plurality of reactive gases can be introduced to one reactive gas showerhead module through a plurality of inlets of one reactive gas showerhead module as long as they do not undergo a chemical reaction and rarely form particles even though they are mixed together inside the reactive gas showerhead module. Thus, the reactive gases having similar properties can be injected by being mixed together inside one reactive gas showerhead module. As a result, this can keep the number of the reactive gas showerhead modules to a minimum even though kinds of reaction gases increases, thereby solving the problems associated with the overall configuration and assembly of the showerhead resulting from the limited space inside the reaction chamber.

BRIEF DESCRIPTION OF THE DRAWINGS

In what follows, the invention will be explained in greater detail using embodiment examples in connection with the drawings. Shown are.

DETAILED DESCRIPTION OF THE PREFERRED EMBODIMENTS

Figure 5:
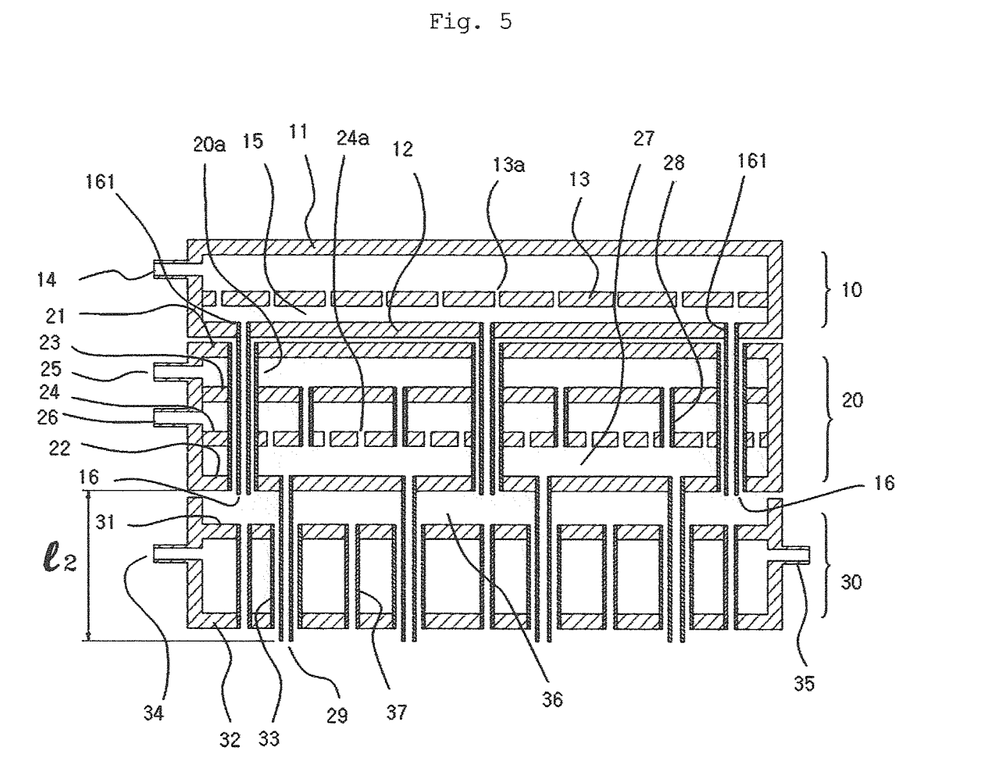
FIG. 5 is a cross-sectional configuration view showing a showerhead according to a first embodiment of the present invention.

Hereinafter preferred embodiments of the present invention will be described in detail with reference to the accompanying drawings. FIG. 5 shows a first embodiment of a showerhead for film-depositing vacuum equipment according to the present invention, including one purge gas showerhead module 10, one reactive gas showerhead module 20 and one cooling jacket 30.

As shown in FIG. 5, the showerhead of the first embodiment is constructed by sequentially stacking one purge gas showerhead module 10, one reactive gas showerhead module 20 and one cooling jacket 30 in the vertical direction from top to bottom, on the assumption that one kind of reactive gas and one kind of purge gas shall be used.

The purge gas showerhead module 10 has an intermediate plate 13 between an upper plate 11 and a bottom plate 12 such that purge gas flows through an inlet 14 into the space between the upper plate 11 and the intermediate plate 13. Then, the purge gas, via a plurality of holes 13a in the intermediate plate 13, enters a diffusion chamber 15 located between the intermediate plate 13 and the bottom plate 12, then the purge gas diffuses in the diffusion chamber. Next, the purge gas is uniformly injected through a plurality of purge-gas injection tubes 16, which are hermetically connected to a plurality of injection holes 161 formed in the bottom plate 12.

The reactive gas showerhead module 20 has first and second intermediate plates 23 and 24 between the upper and bottom plates 21 and 22, such that reactive gas is introduced into the space between the upper plate 21 and the first intermediate plate 23 through an inlet 25, an injection support gas is introduced into the space between the first intermediate plate 23 and the second intermediate plate 24, and the reactive gas and the injection support gas are mixed together in a mixing chamber 27 which is a space between the second intermediate plate 24 and the bottom plate 22.

The reactive gas that has entered the space between the upper plate 21 and the first intermediate plate 23 is introduced into the mixing chamber 27 through connecting tubes 28 which are hermetically connected to the mixing chamber 27 through a plurality of holes formed in the second intermediate plate 23. In mixing chamber 27 the reaction gas and the injection support gas are mixed together, thereby forming a mixture gas. The mixture gas is then uniformly distributed to a plurality of reactive gas injection tubes 29 which are hermetically connected to a plurality of holes formed in the bottom plate 22.

The cooling jacket 30 keeps the temperature of the showerhead in a proper range, for example, from 150 to 200° C. in order to prevent the reactive gas from unintentional particle formation caused by thermal decomposition under an excessively high temperature condition inside the showerhead. The cooling jacket 30 includes an upper plate 31 and a bottom plate 32, and a plurality of guide tubes 33, through which the reactive gas injection tubes 29 are allowed to pass, are hermetically inserted between the upper plate 31 and the bottom plate 32.

Coolant that has been introduced through an inlet 34 of the cooling jacket 30 is dispersed in the inner space and finally exits a reaction chamber (not shown) after passing through an outlet 35. The coolant may be chosen as any of compressed gas, water or the like, but it is very important to guarantee that the coolant does not leak from the cooling jacket 30 into the reaction chamber.

The injection tubes 29 of the reactive gas showerhead module 20 are configured such that they protrude from the bottom plate 32 of the cooling jacket 30 after passing through the inside of guide tubes 33 of the cooling jacket 30, thereby injecting the reactive gas towards a substrate. The injection tubes 16 of the purge gas showerhead module 10 extend down through the reactive gas showerhead module 20 and are then connected to a purge gas redistribution space 36 between the bottom plate 22 of the reactive gas showerhead module 20 and the upper plate 31 of the cooling jacket 30, such that the purge gas is once again uniformly diffused in the said purge gas redistribution space 36, and then the purge gas is injected towards the substrate along the inside of a plurality of the connecting tubes 37 mounted hermetically between the upper plate 31 and the bottom plate 32 of the cooling jacket 30 as well as along a gap between the inner wall of the guide tubes 33 and the outer wall of the reactive gas injection tube 29. The guide tubes 33 of the cooling jacket 30 have to be mounted for the guidance of reactive gas injection tubes, but the connecting tubes 37 may not.

With the configuration of the first embodiment of the present invention as above, as shown in FIG. 5, the purge gas redistribution space 36 is provided between the bottom plate 22 of the reactive gas showerhead module 20 and the upper plate of the cooling jacket 30, and the purge gas showerhead module 10 is disposed above the reactive gas showerhead module 20.

Therefore, the length of the reactive gas injection tubes 29, which is indicated by "l2," is shortened compared to the length ("l1") of the conventional reactive gas injection tubes 111 and 121.

As the length of the reactive gas injection tubes 29 is decreased, it is possible to overcome the problems, such as a warping of the tube or difficulty in assembling during fabrication processes or maintenances of the showerhead. This can also overcome the problems, for example, pressure loss caused by the increased length of the reactive gas injection tubes 29, difficulty in properly supplying the reactive gas, or remaining of the reactive gas in the former process inside the showerhead when depositing several layers of a film.

The ends of the purge gas injection tubes 16, which are connected to a plurality of the purge gas injection holes 161 formed in the bottom plate 12 of the purge gas showerhead module, extend to reach the inside of the purge gas redistribution space 36. However, the length of the purge gas injection tubes 16 is not required to match this. Rather, the purge gas injection tubes 16 may be merely aligned with the guide tubes 20a which are hermetically mounted in the lower reactive gas showerhead module 20. The same function can be performed by merely aligning the purge gas injection hole 161 of the purge gas showerhead module 10 with the guide tubes 20a of the lower reactive gas showerhead module 20 without additional preparation of purge gas injection tubes 16.

Figure 6:
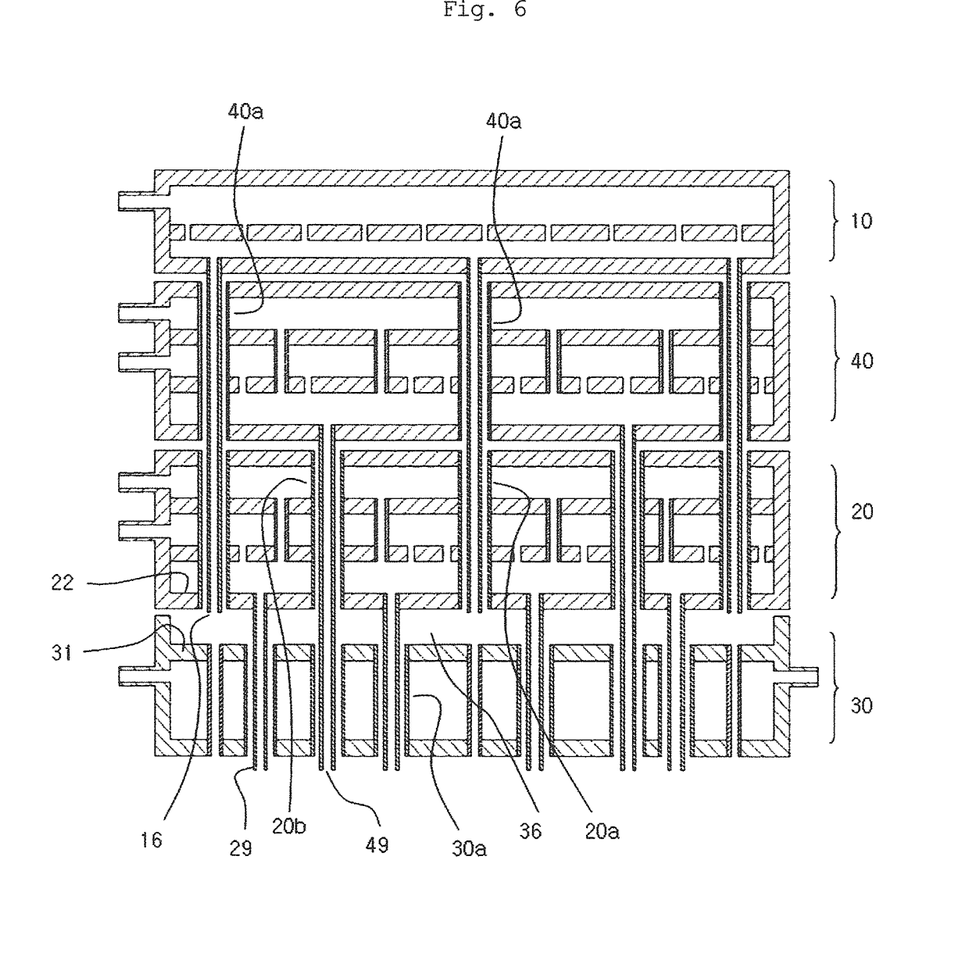
FIG. 6 is a cross-sectional configuration view showing a showerhead according to a second embodiment of the present invention.

FIG. 6 shows a second embodiment of the showerhead for film-depositing vacuum equipment according to the present invention, in which, in addition to the configuration of the first embodiment described above, another reactive gas showerhead module is additionally disposed between the purge gas showerhead module 10 and the reactive gas showerhead module 20, injection tubes 49 of the upper reactive gas showerhead module 40 extend through guide tubes 20b of the lower reactive gas showerhead module 20 and guide tubes 30a of the cooling jacket 30, and the injection tubes 16 of the purge gas showerhead module 10 extend through guide tubes 40a and 20a of the upper and lower reactive gas showerhead modules 40 and 20-followed by being connected to the purge gas redistribution space 36 between the bottom plate 22 of the reactive gas showerhead module 20 and the upper plate 31 of the cooling jacket 30. With this configuration, the purge gas can be uniformly diffused once again in the purge gas redistribution space 36. The other configuration is similar to those of the first embodiment described above.

The configuration of the second embodiment can be effectively used when kinds of reactive gases are increased in the film deposition process. A reactive gas that does not cause a delivering problem even under a considerable pressure drop is introduced into the upper reactive gas showerhead module 40 having relatively longer injection tubes 49. In contrast, a reactive gas that may experience undesirable influences by a pressure drop is introduced into the lower reactive gas showerhead module 20 having relatively shorter injection tubes 29.

Figure 7:
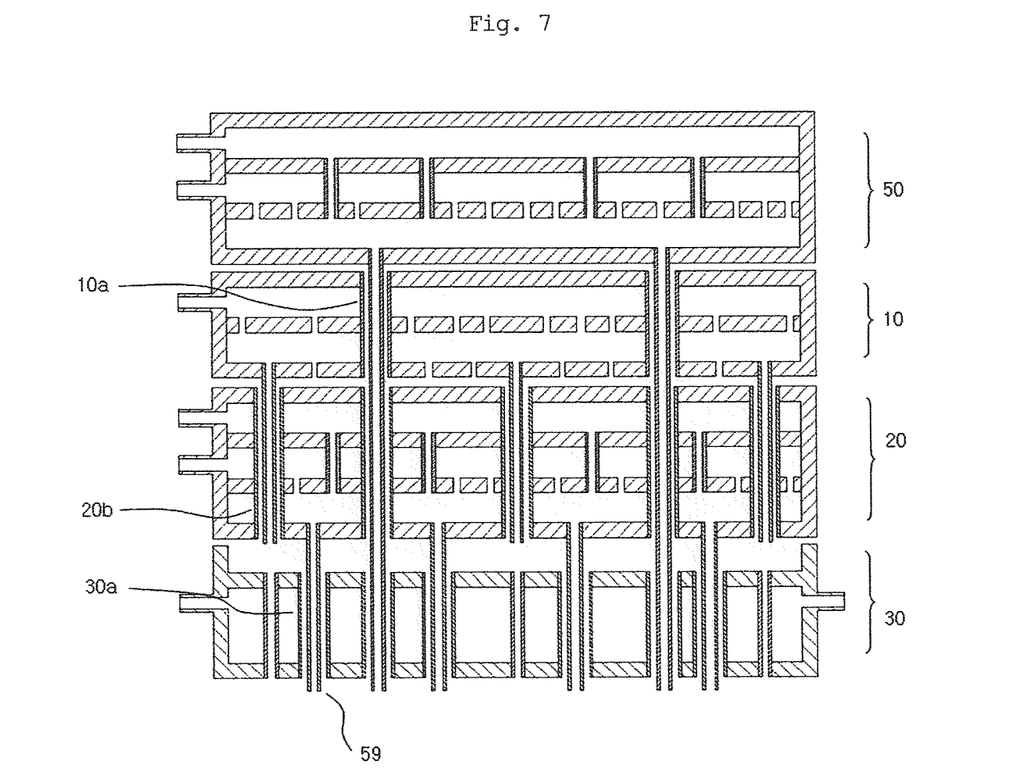
FIG. 7 is a cross-sectional configuration view showing a showerhead according to a third embodiment of the present invention.

FIG. 7 shows a third embodiment of the showerhead for film-depositing vacuum equipment according to the present invention, in which, in addition to the configuration of the first embodiment described above, another reactive gas showerhead module 50 is disposed above the purge gas showerhead module 10, and injection tubes 59 of the upper reactive gas showerhead module 50 extend sequentially through guide tubes 10a, 20b, and 30a of the lower purge gas showerhead module 10, the reactive gas showerhead module 20, and the cooling jacket 30, respectively. The other configuration is similar to those of the first embodiment described above.

Figure 8:
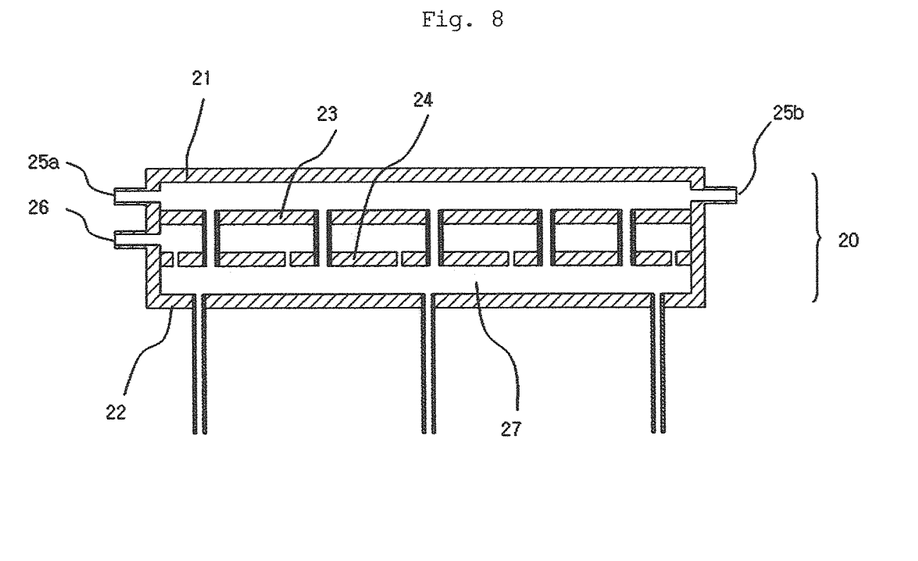
FIG. 8 is a cross-sectional configuration view showing a reactive gas showerhead module of a showerhead according to a fourth embodiment of the present invention.

FIG. 8 shows a fourth embodiment of the showerhead for film-depositing vacuum equipment according to the present invention, in which, in addition to the configuration of the first embodiment described above, a plurality of reactive gases are introduced into the space between the upper plate 21 of the reactive gas showerhead module 20 and the first intermediate plate 23 through a plurality of inlets 25a and 25b, and an injection support gas is introduced into the space between the first intermediate plate 23 and the second intermediate plate 24 through an inlet 26, then the reactive gas and the injection support gas are mixed together in the mixing chamber 27 which is the space between the second intermediate plate 24 and the bottom plate 22. The other configuration is similar to those of the first embodiment described above.

With the configuration of the fourth embodiment as above, a plurality of reactive gases can be introduced through a plurality of the inlets 25a and 25b. Therefore, it is possible to overcome problems associated with unnecessarily increasing the number of reactive gas showerhead modules 20 and problems resulting from the limited space inside the reaction chamber.

Here, it is preferable that the reactive gases introduced through the inlets 25a and 25b of the reactive gas showerhead module 20 are of a similar kind, rarely forming particles when mixed together. Then, such reactive gases are injected by being mixed together in one reactive gas showerhead module 20.

Figure 9:
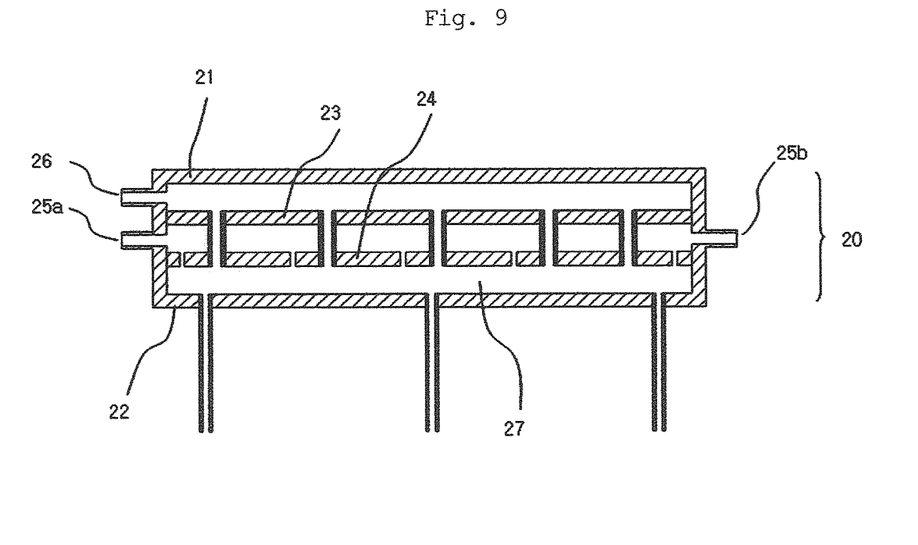
FIG. 9 is a cross-sectional configuration view showing a variation of the reactive gas showerhead module of the showerhead according to the fourth embodiment of the present invention.

FIG. 9 shows a variation of the fourth embodiment of the present invention, in which the reactive gas showerhead module 20 has first and second intermediate plates 23 and 24 between the upper plate 21 and the bottom plate 22. With this configuration, an injection support gas is introduced through an inlet 26 into the space between the upper plate 21 and the first intermediate plate 23, and a plurality of reactive gases are introduced through a plurality of the inlets 25a and 25b into the space between the first and second intermediate plates 23 and 24. Then, the reactive gases and the injection support gas are mixed together inside the mixing chamber 27 which is the space between the second intermediate plate 24 and the bottom plate 22, thereby forming a mixture gas.

In the reactive gas showerhead module 20 like this, it is apparent that the vertical position of a space into which the reactive gases are introduced and the vertical position of a space into which the injection support gas is introduced can be exchanged each other.

Figure 10:
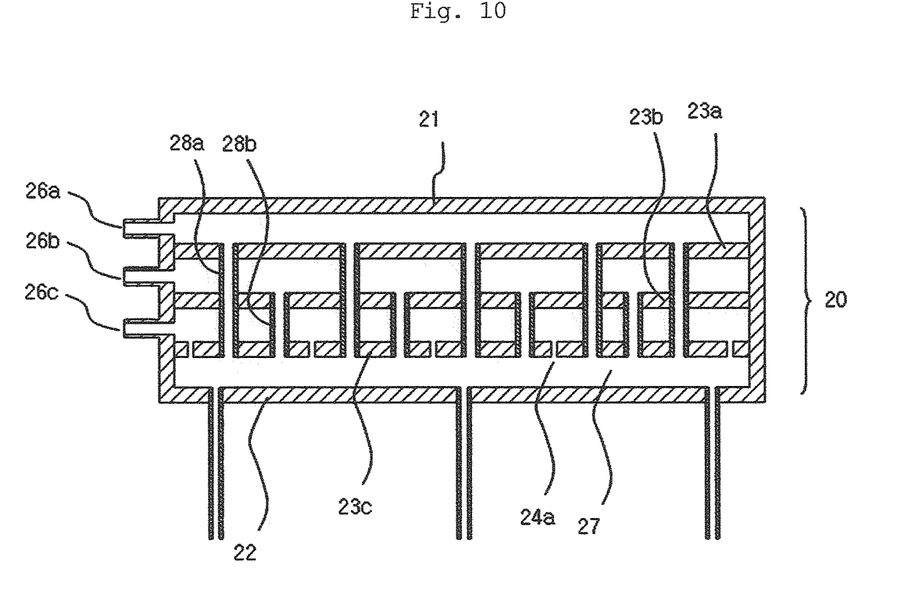
FIG. 10 is a cross-sectional configuration view showing a reactive gas showerhead module of a showerhead according to a fifth embodiment of the present invention.

FIG. 10 shows a fifth embodiment of the showerhead for film-depositing vacuum equipment according to the present invention, in which, in addition to the configuration of the first embodiment described above, first to third intermediate plates 23a, 23b and 23c are formed between the upper plate 21 and the bottom plate 22 of the reactive gas showerhead module 20, such that a kind of reactive gas is introduced into the space between the upper plate 21 and the first intermediate plate 23a through an inlet 26a, another reactive gas of a different kind is introduced into the space between the first and second intermediate plates 23a and 23b through an inlet 26b, and the injection support gas is introduced into the space between the second and third intermediate plates 23b and 23c through an inlet 26c. Then, the two kinds of reactive gases and the injection support gas are mixed together inside the mixing chamber 27 which is the space between the third intermediate plate 23c and the bottom plate 22.

In addition, the first kind of reactive gas that has entered the space between the upper plate 21 and the first intermediate plate 23a is introduced into the mixing chamber 27 through connecting tubes 28a of which ends are respectively sealed to a hole in the first intermediate plate 23a and a hole in the third intermediate plate 23c. The other reactive gas of a different kind that has entered the space between the first intermediate plate 23a and the second intermediate plate is introduced into the mixing chamber 27 through connecting tubes 28b of which ends are respectively sealed to a hole in the second intermediate plate 23b and a hole in the third intermediate plate 23c. The purge gas that has entered the space between the second and third intermediate plates 23b and 23c is introduced into the mixing chamber 27 through a plurality of holes 24a in the third intermediate plate 23c. With this configuration, the two kinds of reactive gases and the injection support gas are mixed together inside the mixing chamber 27, thereby forming a mixture gas. The other configuration is similar to those of the first embodiment described above.

The fifth embodiment of the present invention can carry out the same function as that of the above-described fourth embodiment. Inside the reactive gas showerhead module 20, it is apparent that the vertical position of a space into which the reactive gases are introduced and the vertical position of a space into which the injection support gas is introduced can be exchanged each other as in FIG. 8 and FIG. 9.

While the present invention has been shown and described with reference to certain exemplary embodiments thereof, various changes, variations and substitutions may be apparent to a person having ordinary skill in the art without departing from the spirit and scope of the present invention as defined by the appended claims. It should be understood that such embodiments shall fall within the scope of the present invention.

The present invention makes it possible to prevent the bottom surface of the showerhead from becoming contaminated when depositing multi-component films via chemical vapor deposition while allowing easy adjustment of compositions. Consequently, the stability, reproducibility and productivity of the film deposition process are significantly improved. Therefore, the technology of the present invention can be widely used to fabricate energy related devices, such as LEDs or solar cells which are both based on multi-component compound semiconductors. It can also be effectively used to fabricate a relatively thick piezoelectric film made of a PZT material for an inkjet printer head.

The invention claimed is:

1. A showerhead for film-depositing vacuum equipment for use with a reactive gas and a purge gas, said showerhead comprising a purge gas showerhead module, a first reactive gas showerhead module, a purge gas redistribution space, and a cooling jacket;
   said first reactive gas showerhead module being disposed above said cooling jacket and comprising:
      a ceiling plate, a bottom plate and a wall;
      at least one reactive gas inlet for introducing the reactive gas into said first reactive gas showerhead module; and
      a first plurality of reactive gas injection tubes for injecting the reactive gas for film depositing, wherein said plurality of reactive gas injection tubes extend through said cooling jacket; and
      a plurality of hollow guide tubes having upper and lower ends respectively connected to the ceiling plate and the bottom plate; and
      wherein said cooling jacket comprises an inlet and an outlet, said inlet allowing inflow of a coolant and said outlet allowing outflow of the coolant; and
   said purge gas redistribution space being located below said purge gas showerhead module and between said first reactive gas showerhead module and said cooling jacket;
   said purge gas showerhead module being disposed above said first reactive gas showerhead module and comprising:
      a purge gas inlet for introducing the purge gas into said purge gas showerhead module; and
      a plurality of purge gas injection tubes passing through said guide tubes of the first reactive gas showerhead module for injecting the purge gas into said purge gas redistribution space, the purge gas being subsequently injectable through said cooling jacket for film depositing.

2. A showerhead according to claim 1 further comprising a second reactive gas showerhead module and having a second plurality of reactive gas injection tubes, said second reactive gas showerhead module being disposed between said first reactive gas showerhead module and said purge gas showerhead module;
   said second plurality of reactive gas injection tubes extending sequentially through said first reactive gas showerhead module and said cooling jacket.

3. A showerhead according to claim 1 further comprising a second reactive gas showerhead module and having a second plurality of reactive gas injection tubes, said second reactive gas showerhead module being disposed above said purge gas showerhead module;
   said second plurality of reactive gas injection tubes extending sequentially through said purge gas showerhead module, said first reactive gas showerhead module and said cooling jacket.

4. A showerhead according to claim 1 wherein said first reactive gas showerhead module further comprises:
   an upper plate and a bottom plate;
   a first intermediate plate and a second intermediate plate located between said upper plate and said bottom plate;
   wherein said at least one reactive gas inlet comprises a plurality of reactive gas inlets for introducing a plurality of reactive gases into a space between said upper plate and said first intermediate plate;
   an injection support gas inlet for introducing an injection support gas into a space between said first intermediate plate and said second intermediate plate; and
   a mixing chamber located between said second intermediate plate and said bottom plate, said mixing chamber allowing the mixture of the plurality of reactive gases and the injection support gas for forming a mixture gas.

5. A showerhead according to claim 1 wherein said first reactive gas showerhead module further comprises:
   an upper plate and a bottom plate;
   a first intermediate plate and a second intermediate plate located between said upper plate and said bottom plate;
   an injection support gas inlet for introducing an injection support gas into a space between said upper plate and said first intermediate plate;
   wherein said at least one reactive gas inlet comprises a plurality of reactive gas inlets for introducing a plurality of reactive gases into a space between said first intermediate plate and said second intermediate plate; and
   a mixing chamber located between said second intermediate plate and said bottom plate, said mixing chamber allowing the mixture of the plurality of reactive gases and the injection support gas for forming a mixture gas.

6. A showerhead according to claim 1 wherein said first reactive gas showerhead module further comprises:
- an upper plate and a bottom plate;
- a first intermediate plate, a second intermediate plate and a third intermediate plate located between said upper plate and said bottom plate;
- wherein said at least one reactive gas inlet comprises:
    - a first inlet for introducing a first reactive gas into a space between said upper plate and said first intermediate plate;
    - a second inlet for introducing a second reactive gas into a space between said first intermediate plate and said second intermediate plate; and
    - a third inlet for introducing an injection support gas into a space between said second intermediate plate and said third intermediate plate; and
- a mixing chamber located between said third intermediate plate and said bottom plate, said mixing chamber allowing the mixture of the first reactive gas, the second reactive gas and the injection support gas for forming a mixture gas.

\* \* \* \* \*